(12) United States Patent
Chang et al.

(10) Patent No.: US 8,789,378 B2
(45) Date of Patent: Jul. 29, 2014

(54) MAGNETIC FLUX DETECTION APPARATUS

(75) Inventors: Shao Hsiung Chang, Taoyuan Hsien (TW); Chii-How Chang, Taoyuan Hsien (TW)

(73) Assignee: Delta Electronics, Inc., Kuei San, Taoyuan Hsien (TW)

( * ) Notice: Subject to any disclaimer, the term of this patent is extended or adjusted under 35 U.S.C. 154(b) by 1002 days.

(21) Appl. No.: 12/872,751

(22) Filed: Aug. 31, 2010

(65) Prior Publication Data

US 2011/0050217 A1 Mar. 3, 2011

Related U.S. Application Data

(60) Provisional application No. 61/238,520, filed on Aug. 31, 2009.

(51) Int. Cl.
*F25B 21/00* (2006.01)

(52) U.S. Cl.
USPC .......................................................... 62/3.1

(58) Field of Classification Search
USPC ............................. 62/3.1; 335/300, 302, 306
See application file for complete search history.

(56) References Cited

U.S. PATENT DOCUMENTS

| | | | | |
|---|---|---|---|---|
| 6,935,121 B2* | 8/2005 | Fang et al. | | 62/3.1 |
| 7,596,955 B2* | 10/2009 | Muller et al. | | 62/3.1 |
| 2008/0078184 A1* | 4/2008 | Saito et al. | | 62/3.1 |
| 2008/0223853 A1* | 9/2008 | Muller et al. | | 219/672 |
| 2008/0236171 A1* | 10/2008 | Saito et al. | | 62/3.1 |

* cited by examiner

*Primary Examiner* — Melvin Jones
(74) *Attorney, Agent, or Firm* — Muncy, Geissler, Olds & Lowe, P.C.

(57) ABSTRACT

A magnetic flux detection apparatus and a system with the magnetic flux detection apparatus are provided. The magnetic flux detection apparatus includes the magnetic material, at least one heated or cooled magneto caloric effect material (MCEM), a permanent magnetic element, at least one magnetic sensing element, and at least one amount of magnetic flux or magnetic flux path. The heated or cooled magneto caloric effect material is disposed to the magnetic material. The amount of magnetic flux or magnetic flux path is formed and passing through the permanent magnetic element, the cooled magneto caloric effect material, and the first portion of the magnetic material. A magnetic sensing element senses the amount of the magnetic flux or the magnetic flux path for outputting a sensing voltage and a corresponding sensing voltage value so as to apply the best thermal energy-applying algorithm into the magnetic system to output power efficiently.

25 Claims, 18 Drawing Sheets

4e

4f

9b

| | MCM temperature | | | | | |
|---|---|---|---|---|---|---|
| Step | 904b,904e | 904a,904d | 904c,904f | 904b,904e | 904a,904d | 904c,904f |
| 1 | H | L | L | H | L | L |
| 2 | L | L | H | L | H | L |
| 3 | L | H | L | L | L | H |
| 4 | H | L | L | H | L | L |
| 5 | L | L | H | L | H | L |
| 6 | L | H | L | L | L | H |
| H:High temperature, above Tc
L:Low temperature, below Tc | | | | | | |

11a

11b

11c

12d

12e

12f

MAGNETIC FLUX DETECTION APPARATUS

CROSS REFERENCE TO RELATED APPLICATIONS

This application claims the benefit of U.S. Provisional Application No. 61/238,520, filed Aug. 31, 2009, the entirety of which is incorporated by reference herein.

BACKGROUND OF THE INVENTION

1. Field of the Invention

The invention relates to a magnetic flux detection apparatus and, in particular, to a magnetic flux detection apparatus which can detect the major amount of the magnetic flux or the major magnetic flux path to determine the voltage generated by the magnetic flux detection apparatus so as to apply the best thermal energy-applying algorithm into the magnetic system to acquire power efficiently.

2. Description of the Related Art

There are many ways to produce renewable power such as using solar panel to collect the sunlight and convert the sunlight into power. The conventional magneto caloric effect (MCE) principle is well-known to be applied to manufacture the magnetic refrigerator which is described in the published paper "Performance of a room-temperature rotary magnetic refrigerator", International Journal of Refrigeration 29 (2006) 1327-1331. For the magnetic cooling application, the magnetic field is chosen to change the magnetic phase of the magneto caloric effect material (MCEM) so as to cause the change of magnetic entropy of the MCEM. Therefore, the temperature of the MCEM will also be changed. The larger the magnetic moment changes, the larger cooling capacity will be achieved.

As shown in FIG. 1a and FIG. 1b, a conventional magnetic refrigerator 1 mainly includes a motor 124, a pump 108, a rotary value 104, a permanent magnet 120, an iron yoke 126, and four active magnetic regeneration (AMR) beds 122a, 122b, 122c, and 122d. Each AMR bed which is formed of one kind of MCEM is composed of Gd-based alloy spheres. The motor 124 rotates with the permanent 120. The magnetic phase of the AMR bed changes so as to result the change of magnetic entropy of the AMR bed. Therefore, the temperature of the AMR bed will also change. The pump 108 circulates the heat transfer fluid (water) and the rotary valve 104 switches the flow lines. Initially, the water is cooled as it is pumped from the hot end to the cold end of the demagnetized beds. Subsequently, the water picks up a thermal load as it passes through the cold stage, and then absorbs heat as it travels from the cold end to the hot end of the magnetized beds. The heat is given up as the water passes through the exhaust-side heat exchanger 112.

FIG. 2 shows relationship curves of the magnetic field versus the magnetized scale of the Gadolinium which is one kind of magneto caloric effect material (MCEM), and the curves also show the magnetization of Gadolinium is dependent to the temperature. For the environmental protection, other method to acquire the renewable energy is necessary. The MCEM is not only suitable for the magnetic refrigeration but also for the heat-power conversion application to output the power.

BRIEF SUMMARY OF THE INVENTION

A detailed description is given in the following embodiments with reference to the accompanying drawings.

In view of the foregoing, one embodiment of the invention provides a magnetic flux detection apparatus that can detect the major amount of the magnetic flux or the major magnetic flux path to output a voltage so as to apply a thermal energy-applying algorithm into the magnetic device and the whole magnetic system. Therefore, a better working condition of the magnetic device and the whole magnetic system can be selected for demonstrating a better performance.

To achieve the above, the invention discloses a magnetic flux detection apparatus. The magnetic flux detection apparatus includes the magnetic material, at least one heated or cooled magneto caloric effect material (MCEM), the permanent magnetic element, at least one magnetic sensing element, and at least one amount of magnetic flux or magnetic flux path. The heated or cooled magneto caloric effect material (MCEM) is disposed to the magnetic material. The permanent magnetic element is coupled to the magneto caloric effect material (MCEM). The major amount of magnetic flux or major magnetic flux path is formed and passing through the permanent magnetic element, the cooled magneto caloric effect material (MCEM), and the first portion of the magnetic material. The magnetic sensing element senses the major amount of the magnetic flux or the major magnetic flux path for outputting a sensing voltage and a correspondingly sensing voltage value.

In addition, the invention also discloses a magnetic flux detection apparatus further includes a recording module and a controlling module. The recording module has a sensing voltage table recording at least one predetermined sensing voltage value corresponding to at least one thermal controlling signal respectively. The controlling module connects to the recording module and receives the sensing voltage and the correspondingly sensing voltage value, wherein when the correspondingly sensing voltage value reaches the predetermined sensing voltage value in the recording module, the controlling module generates the thermal controlling signal to heat or cool the magneto caloric effect material (MCEM).

The invention also discloses a magnetic flux detection apparatus includes a magnetic material, at least one heated or cooled magneto caloric effect material (MCEM), a permanent magnetic element, at least one magnetic sensing element, at least one major first amount of magnetic flux or major first magnetic flux path, and at least one major second amount of magnetic flux or major second magnetic flux path. The magnetic material has at least one bypass magnetic material or at least one bypass yoke. The heated or cooled magneto caloric effect material (MCEM) is disposed to the magnetic material. The permanent magnetic element is coupled to the magneto caloric effect material (MCEM). The magnetic sensing element surrounds a first portion of the bypass magnetic material or a first portion of the bypass yoke. The major first amount of magnetic flux or major first magnetic flux path is formed and passing through the permanent magnetic element, the cooled magneto caloric effect material (MCEM), and the magnetic material. The major second amount of magnetic flux or major second magnetic flux path is formed and passing through the permanent magnetic element, the cooled magneto caloric effect material (MCEM), and the bypass magnetic material or the bypass yoke. The magnetic sensing element senses the major second amount of the magnetic flux or the major second magnetic flux path for outputting a sensing voltage and a correspondingly sensing voltage value.

Furthermore, the invention also discloses a magnetic flux detection apparatus includes a magnetic material, at least one active magnetic regenerator (AMR) bed, a permanent magnetic element, at least one magnetic sensing element, and at least one major amount of magnetic flux or major magnetic flux path. The active magnetic regenerator (AMR) bed is disposed to the magnetic material. The permanent magnetic element is coupled to the active magnetic regenerator (AMR) bed. The magnetic sensing element surrounds a first portion of the magnetic material. The major amount of magnetic flux or the major magnetic flux path is formed and passing through the permanent magnetic element, the active magnetic regenerator (AMR) bed, and the first portion of the magnetic material. The magnetic sensing element senses the major amount of the magnetic flux or the major magnetic flux path for outputting a sensing voltage and a correspondingly sensing voltage value.

As mentioned above, the magnetic flux detection apparatus of the invention can detect the major amount of the magnetic flux or the major magnetic flux path to determine the voltage generated by the magnetic flux detection apparatus so as to apply the best thermal energy-applying algorithm into the magnetic system. Hence, the invention can control the temperature of each of the magneto caloric effect materials (MCEMs) precisely. Therefore, the permanent magnetic element can rotate more smoothly to save more mechanical energy which can be turned into more power. In this way, a better working condition of the magnetic device and the whole magnetic system can be selected for demonstrating a better performance.

BRIEF DESCRIPTION OF THE DRAWINGS

The present invention can be more fully understood by reading the subsequent detailed description and examples with references made to the accompanying drawings, wherein:

FIG. 3b is a schematic diagram showing a top view of a heat-power conversion magnetic device and two main magnetic flux paths when the hot thermal energy is applied to the MCEM 304b and the cold thermal energy is applied to the MCEM 304c and MCEM 304a;

FIG. 9a is a schematic diagram showing a top view of a magnetic flux detection apparatus with a magnetic material, six MCEMs, and a permanent magnetic element with a yoke and four poles according to a eleventh preferred embodiment of the invention;

FIG. 9b is a table showing the sequence of heating and cooling the six MCEMs so as to control the rotating direction of the permanent magnetic element as shown in FIG. 9a.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The magneto caloric effect material (MCEM) is not only suitable for the magnetic refrigeration but also for the heat-power conversion application. It is an important subject to provide an acquiring renewable energy system (which is also a magnetic system in this invention) and a magnetic flux detection apparatus so as to apply the best thermal energy-applying algorithm into the magnetic system to output power efficiently. In addition, different kinds of magneto caloric effect material (MCEM) have their own Curie temperature (Tc). The magneto caloric effect material (MCEM) usually has the dramatically magnetic moment change when the temperature of the materials is changed around its Curie temperature (Tc). Such kinds of materials are perfectly suitable for heat to power conversion.

Figure 3A:
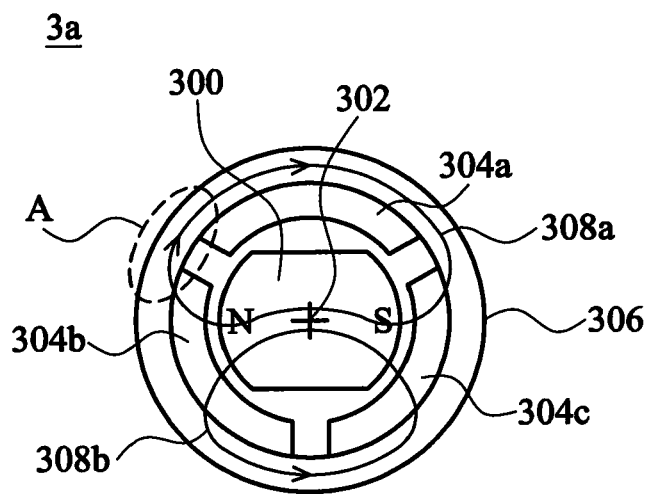
FIG. 3a is a schematic diagram showing a top view of a heat-power conversion magnetic device and two main magnetic flux paths when the hot thermal energy is applied to the MCEM 304a and the cold thermal energy is applied to the MCEM 304b and MCEM 304c.

As shown in FIG. 3a, a heat-power conversion magnetic device 3a includes a high permeability magnetic material 306, a rotation axis 302, three magneto caloric effect materials (MCEMs) 304a, 304b, and 304c, and a permanent magnetic element 300 such as a permanent magnet or a Halbach-array magnet. The three magneto caloric effect materials (MCEMs) 304a, 304b, and 304c are disposed to the high permeability magnetic material 306. The permanent magnetic element 300 is coupled to the magneto caloric effect materials (MCEMs) 304a, 304b, and 304c. Two major magnetic flux paths 308a, 308b are formed when the hot thermal energy is applied to the magneto caloric effect material (MCEM) 304a and the cold thermal energy is applied to the magneto caloric effect material (MCEM) 304b and magneto caloric effect material (MCEM) 304c. When the hot thermal energy is applied to magneto caloric effect material (MCEM) 304a, the magnetic moment of magneto caloric effect material (MCEM) 304a is changed to low magnetic moment state. In addition, when the cold thermal energy is applied to magneto caloric effect material (MCEM) 304b and 304c; the magnetic moment of magneto caloric effect material (MCEM) 304b and 304c are changed to high state. One major magnetic flux 308b generated by the permanent magnetic element 300 flows through magneto caloric effect material (MCEM) 304b, high permeability magnetic material 306 and magneto caloric effect material (MCEM) 304c then returns to the permanent magnetic element 300. The other major magnetic flux 308a generated by the permanent magnetic element 300 flows through magneto caloric effect material (MCEM) 304b, high permeability magnetic material 306 and magneto caloric effect material (MCEM) 304c then return to the permanent magnetic element 300. The heat-power conversion magnetic device 3a now is in its static state and maintains the permanent magnetic element 300 in horizontal position with the lowest magnetic resistance.

Figure 3B:
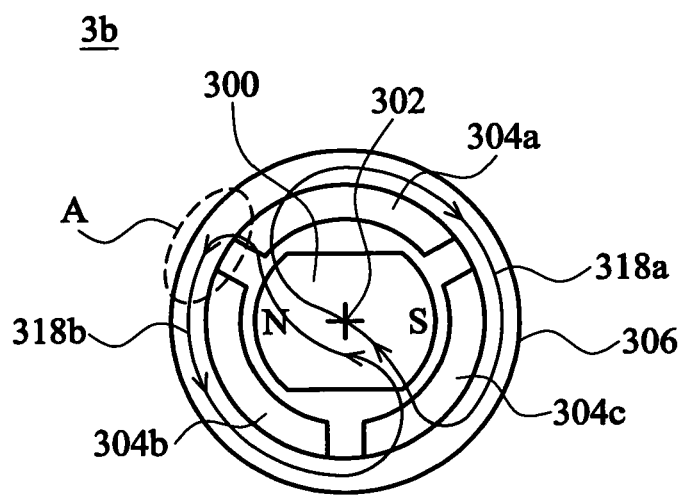

As shown in FIG. 3b, the structure of the heat-power conversion magnetic device 3b is the same with the heat-power conversion magnetic device 3a. When the hot thermal energy is applied to the magneto caloric effect material (MCEM) 304b and cold thermal energy is applied to magneto caloric effect material (MCEM) 304a and magneto caloric effect material (MCEM) 304c, the magnetic moment of magneto caloric effect material (MCEM) 304b is at low level state and magnetic moment of the magneto caloric effect material (MCEM) 304a and 304c are at high level state. The magnetic pole N of the permanent magnetic element 300 will be attracted by magneto caloric effect material (MCEM) 304a and magnetic pole S of the permanent magnetic element 300 will be attracted by magneto caloric effect material (MCEM) 304c. Therefore, the permanent magnetic element 300 will rotate and the mechanical torque is generated through the rotation axis 302. If it continuously changes the heating and cooling sequence of magneto caloric effect material (MCEM)

304a, 304b and 304c, it will produce continuous mechanical torque output and the mechanical torque can be converted into power.

The portion "A" in FIG. 3a and FIG. 3b represents that the major amount of magnetic flux flows in clockwise (CW) direction when the magneto caloric effect material (MCEM) 304a is heated (FIG. 3a) and the other major magnetic flux flows in counterclockwise (CCW) direction when the magneto caloric effect material (MCEM) 304b is heated (FIG. 3b). It is obviously, heating and cooling the magneto caloric effect materials (MCEMs) 304a, 304b, and 304c will change the magnetic moment of the magneto caloric effect materials (MCEMs) 304a, 304b, and 304c so as to induce the change of the amount of the magnetic flux.

Figure 4A:
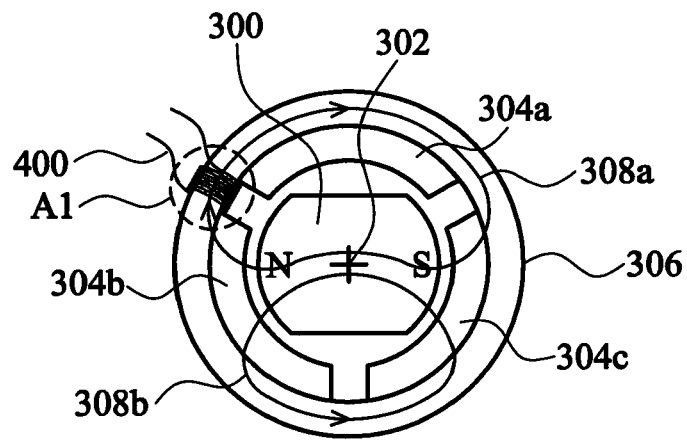
FIG. 4a is a schematic diagram showing a top view of a magnetic flux detection apparatus with a magnetic sensing element and two main magnetic flux paths when the hot thermal energy is applied to the MCEM 304a and the cold thermal energy is applied to the MCEM 304b and MCEM 304c according to a first preferred embodiment of the invention.
Figure 4B:
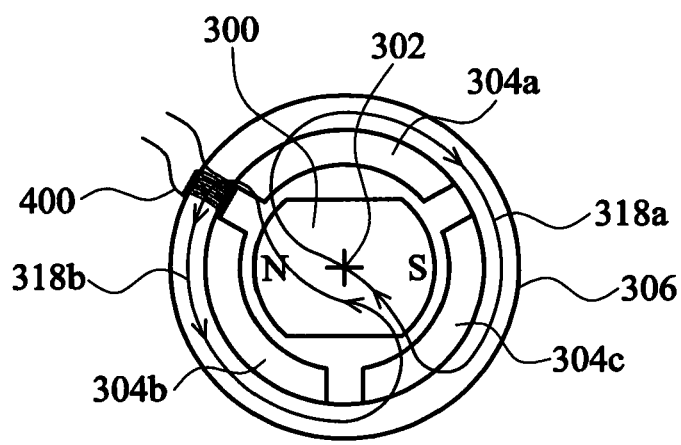
FIG. 4b is a schematic diagram showing a top view of a magnetic flux detection apparatus with a magnetic sensing element and two main magnetic flux paths when the hot thermal energy is applied to the MCEM 304b and the cold thermal energy is applied to the MCEM 304c and MCEM 304a according to a second preferred embodiment of the invention.

As shown in FIG. 4a, a magnetic flux detection apparatus 4a is provided to achieve a better performance as a first preferred embodiment of the invention comparing with the heat-power conversion magnetic device 3a and 3b. The magnetic flux detection apparatus 4a includes a magnetic material 306, at least one heated or cooled magneto caloric effect material (MCEM) 304a, 304b, and 304c, and the permanent magnetic element 300 such as a permanent magnet or a Halbach-array magnet, a magnetic sensing element 400, and at least one major amount of magnetic flux or major magnetic flux path 308a, and 308b. The heated magneto caloric effect material (MCEM) 304a and the cooled magneto caloric effect materials (MCEMs) 304b, and 304c are disposed to and attached along with the magnetic material 306. The permanent magnetic element 300 is coupled to and disposed in the magneto caloric effect materials (MCEMs) 304a, 304b, and 304c. The major amount of magnetic flux or the major magnetic flux path 308a is formed and passing through the permanent magnetic element 300, the cooled magneto caloric effect materials (MCEMs) 304b, 304c, and the first portion A1 of the magnetic material 306. The magnetic material 306 can be a high permeability magnetic material or a yoke. The magnetic material 306 is a circle-shaped structure in the first preferred embodiment. However, the magnetic material 306 can also be a oval-shaped, rectangular-shaped, annular-shaped, or polygonal-shaped structure. The magnetic sensing element 400, such as a coil, surrounds the first portion A1 of the magnetic material 306 senses the major amount of the magnetic flux or the major magnetic flux path 308a to induce a voltage in the coil when the major amounts magnetic flux are changed from the status in FIG. 4a to the status in FIG. 4b as a second preferred embodiment of the invention. In FIG. 4b, the hot thermal energy is applied to the magneto caloric effect material (MCEM) 304b and cold thermal energy is applied to magneto caloric effect materials (MCEMs) 304a and 304c. The major amount of magnetic flux or the magnetic flux path has changed. Therefore, the magnetic sensing element 400 can be used for outputting a sensing voltage and a correspondingly sensing voltage value.

From the Faraday's induction law, $E=-NS(dB/dt)$, wherein E is the induction voltage, N is the amount of turns of coil, S is the area where the magnetic flux passes, and B is the magnetic flux density.

Figure 4C:
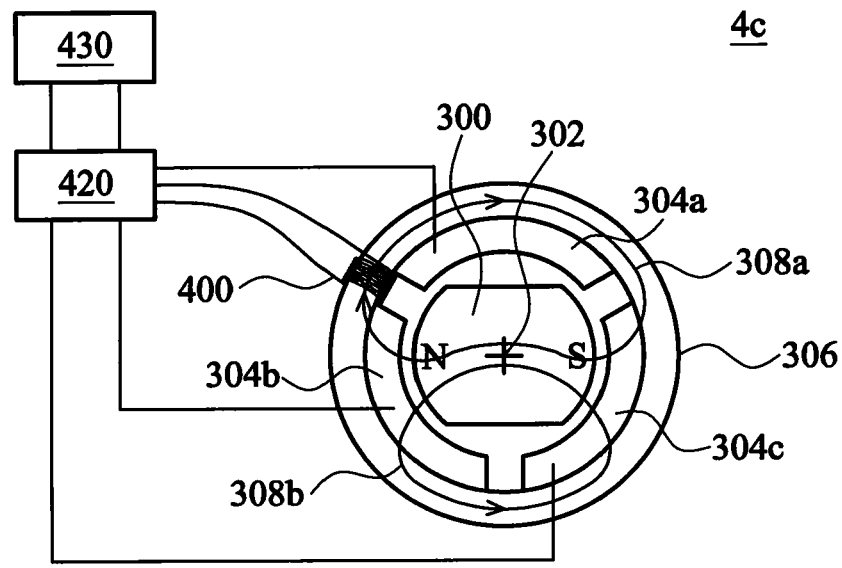
FIG. 4c is a schematic diagram showing a top view of a magnetic flux detection apparatus with a magnetic sensing element including a recording module, a controlling module and two main magnetic flux paths when the hot thermal energy is applied to the MCEM 304a and the cold thermal energy is applied to the MCEM 304b and MCEM 304c according to a third preferred embodiment of the invention.

The voltage detection can be used for determining when the thermal energy shall be applied. For example, as shown in FIG. 4c, the structure of the magnetic flux detection apparatus 4c is the same with the structure as described in FIG. 4a and further includes a recording module 430 and a controlling module 420 according to a third preferred embodiment of the invention. The recording module 430 has a sensing voltage table recording at least one predetermined sensing voltage and corresponding sensing voltage value respectively. The controlling module 420 receives the sensing voltage and acquires the correspondingly sensing voltage value from the recording module 430, wherein when the correspondingly sensing voltage value reaches the predetermined sensing voltage value in the recording module 430, the controlling module 420 generates the thermal controlling signal to heat or cool the magneto caloric effect materials (MCEMs) 304a, 304b, and 304c. The permanent magnetic element 300 is a magnet with at least two magnetic poles and rotates after the controlling module 420 generates the thermal controlling signal to heat or cool the magneto caloric effect materials (MCEMs) 304a, 304b, and 304c.

In the third preferred embodiment shown in FIG. 4c, the cooled magneto caloric effect material (MCEM) 304b will be heated periodically and the heated magneto caloric effect material (MCEM) 304a will be alternately cooled periodically and disposed to the magnetic material 306, and the permanent magnetic element 300 with at least two magnetic poles rotates after the controlling module 420 generates the thermal controlling signal to heat the cooled magneto caloric effect material (MCEM) 304b or cool the heated magneto caloric effect material (MCEM) 304a periodically.

Figure 4D:
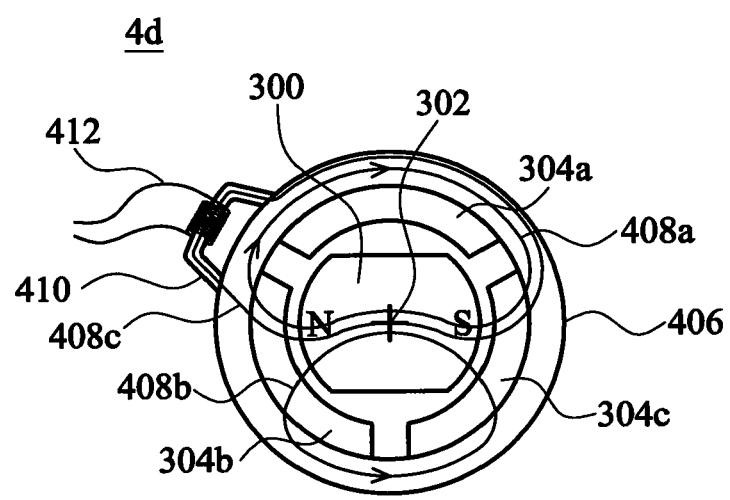
FIG. 4d is a schematic diagram showing a top view of a magnetic flux detection apparatus with a magnetic sensing element including a magnetic material having one bypass magnetic material or one bypass yoke, and two main magnetic flux paths when the hot thermal energy is applied to the MCEM 304a and the cold thermal energy is applied to the MCEM 304b and MCEM 304c according to a fourth preferred embodiment of the invention.

As shown in FIG. 4d, a magnetic flux detection apparatus 4d is provided as a fourth preferred embodiment of the invention. The magnetic flux detection apparatus 4d includes a magnetic material 406, at least one heated or cooled magneto caloric effect material (MCEM) 304a, 304b, and 304c, a permanent magnetic element 300, at least one magnetic sensing element 412, at least one major first amounts of magnetic flux or first magnetic flux paths 408a, and 408b, and at least one major second amount of magnetic flux or major second magnetic flux path 408c. The magnetic material 406 has at least one bypass magnetic material 410 or at least one bypass yoke 410. The heated or cooled magneto caloric effect materials (MCEMs) 304a, 304b, and 304c are disposed to the magnetic material 406. The permanent magnetic element 300 is coupled to the magneto caloric effect materials (MCEMs) 304a, 304b, and 304c. The magnetic sensing element 412, such as a coil, surrounds a first portion of the bypass magnetic material 410 or a first portion of the bypass yoke 410. The major first amounts of magnetic flux or major first magnetic flux paths 408a, and 408b are formed and passing through the permanent magnetic element 300, the cooled magneto caloric effect materials (MCEMs) 304b, and 304c, and the magnetic material 406. The major second amount of magnetic flux or major second magnetic flux path 408c is formed and passing through the permanent magnetic element 300, the cooled magneto caloric effect materials (MCEMs) 304b, and 304c, and the bypass magnetic material 410 or the bypass yoke 410. The magnetic sensing element 412 senses the major second amount of the magnetic flux or the major second magnetic flux path 410 for outputting a sensing voltage.

In addition, the structure of the magnetic flux detection apparatus 4d can further includes a recording module, such as the recording module 430 shown in FIG. 4c and a controlling module 420, such as the controlling module 420 shown in FIG. 4c. The structures and functions of the recording module 430 and a controlling module 420 have been described in the above paragraph. Therefore, it is not described here again.

Figure 4E:
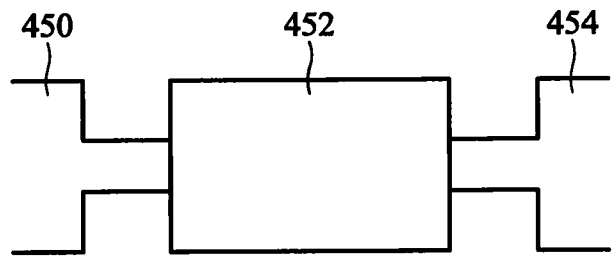
FIG. 4e is a side schematic view of a magnetic force generating device with a single-layer MCEM.

As shown in FIG. 4e, a side schematic view of a magnetic force generating device 4e with a single-layer magneto caloric effect material (MCEM) is demonstrated. The magnetic force generating device 4e includes the hot side chamber 450, the cool side chamber 454 and the single-layer magneto caloric effect material (MCEM) 452. The magnetic force generating device 4e utilizes the magneto-caloric-effect properties of certain materials, such as Gadolinium or certain alloys and forms a single-layer magneto caloric effect material (MCEM) 452. The magnetic force generating device 4e also has the particularity of magnetizing when a cool fluid is filled in the cool side chamber 454 so as to cool the single-layer magneto caloric effect material (MCEM) 452. Therefore, the amount of the magnetic flux or the magnetic flux path can be formed from the permanent magnetic element to the single-layer magneto caloric effect material (MCEM) 452. On the contrary, the magnetic force generating device 4e has the particularity of demagnetizing when a heated fluid is filled in the hot side chamber 450 so as to heat up the single-layer magneto caloric effect material (MCEM) 452. Therefore, the amount of magnetic flux or the magnetic flux path can not be formed from the permanent magnetic element to the single-layer magneto caloric effect material (MCEM) 452. In addition, the heated or cooled magneto caloric effect material (MCEM) 452 is a single-layer magneto caloric effect material (MCEM) with a single curie temperature.

Figure 4F:
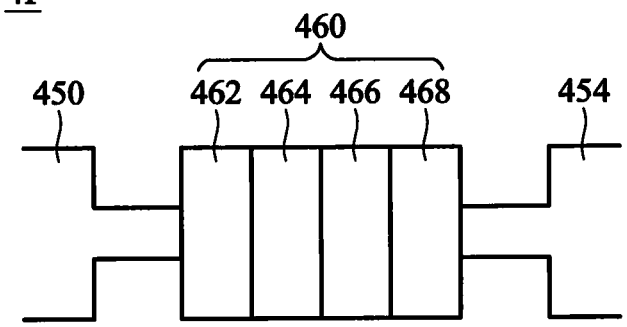
FIG. 4f is a side schematic view of a magnetic force generating device with a multiple-layers MCEM.
Figure 4G:
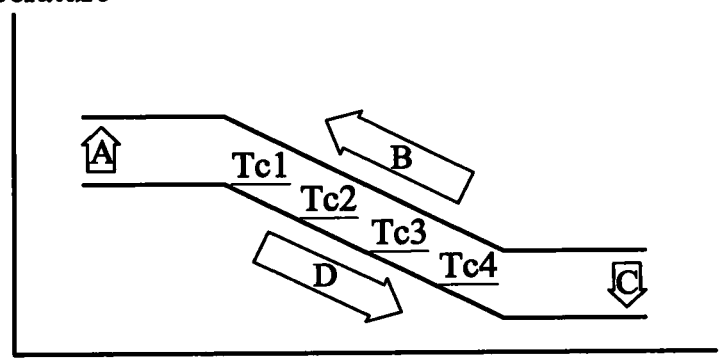
FIG. 4g shows relationship curves of the multiple-layers MCEM structure of FIG. 4f versus the temperature, and it also shows the Curie temperature of each layer of the multiple-layers MCEM structure.

As shown in FIG. 4f and FIG. 4g, a side schematic view of a magnetic force generating device with a multiple-layer magneto caloric effect material (MCEM) is demonstrated. The magnetic force generating device 4f includes the hot side chamber 450, the cool side chamber 454 and the multiple-layer magneto caloric effect material (MCEM) 460 (four-layer MCEM) with a plurality of Curie temperatures (four curie temperature). Each layer of the multiple-layer magneto caloric effect material (MCEM) 460 has its own Curie temperature. For example, the layer 462 has the Curie temperature Tc1, the layer 464 has the Curie temperature Tc2, the layer 466 has the Curie temperature Tc3, and the layer 468 has the Curie temperature Tc4. The way to heat or cool the magnetic force generating device 4f is the same as described in the above paragraph. Therefore, it is not described here again. Each layer of the multiple-layers magneto caloric effect material (MCEM) 460 is disposed sequentially according to the single curie temperature of each layer of the multiple-layers magneto caloric effect material (MCEM) 460 (Tc1>Tc2>Tc3>Tc4). Pushing the working fluid of hot side chamber 450 and cool side chamber 454 back and forth, a temperature gradient is generated in the flow direction as shown in FIG. 4g. When the working fluid is pushed from hot side chamber 450 to cool side chamber 454, the temperature of each layer of the multiple-layers magneto caloric effect material (MCEM) 460 is higher than its Curie temperature. When the working fluid is pushed from cool side chamber 454 to hot side chamber 450, the temperature of each layer of the multiple-layers magneto caloric effect material (MCEM) 460 is lower than its Curie temperature. The arrows A, B, C, and D represent the four processes of FIG. 4g and show the change of temperature. Back to the FIG. 4a-4d, the magneto caloric effect materials (MCEMs) 304a, 304b, and 304c can be a single-layer magneto caloric effect material (MCEM) having a single curie temperature or a multiple-layers magneto caloric effect material (MCEMs) having a plurality of curie temperatures.

Figure 5A:
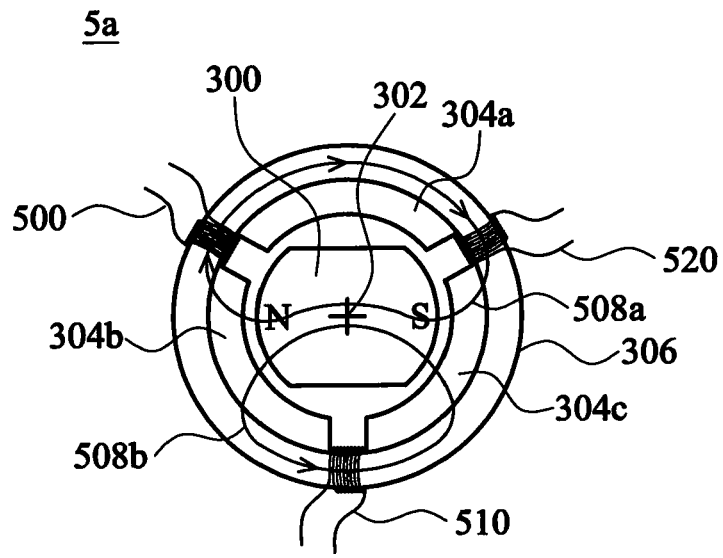
FIG. 5a is a schematic diagram showing a top view of a magnetic flux detection apparatus with three magnetic sensing elements and two main magnetic flux paths when the hot thermal energy is applied to the MCEM 304a and the cold thermal energy is applied to the MCEM 304b and MCEM 304c according to a fifth preferred embodiment of the invention.
Figure 5B:
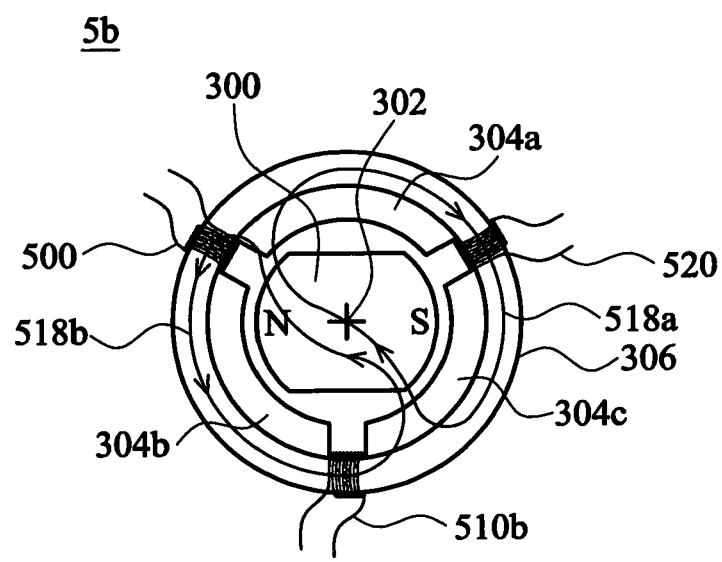
FIG. 5b is a schematic diagram showing a top view of a magnetic flux detection apparatus with three magnetic sensing elements and two main magnetic flux paths when the hot thermal energy is applied to the MCEM 304b and the cold thermal energy is applied to the MCEM 304c and MCEM 304a according to a sixth preferred embodiment of the invention.

As shown in FIG. 5a, a magnetic flux detection apparatus 5a is provided as a fifth preferred embodiment of the invention. The magnetic flux detection apparatus 5a includes a magnetic material 306, at least one heated or cooled magneto caloric effect material (MCEM) 304a, 304b, and 304c, and the permanent magnetic element 300 such as a permanent magnet or a Halbach-array magnet, three magnetic sensing elements 500, 510, and 520, and at least one amount of magnetic flux or major magnetic flux path 508a, and 508b. The three magnetic sensing element 500, 510, and 520, such as three coils, surround respectively in the three portions of the magnetic material 306 and sense the major amounts of the magnetic flux or the major magnetic flux paths 508a, 508b, and 508c to induce voltages in each of the coils when the major amount of magnetic flux is changed from the status in FIG. 5a to the status in FIG. 5b which shows a sixth preferred embodiment of the invention. Because most amounts of the magnetic flux generated by the permanent magnetic element 300 will flow through the three magnetic sensing elements 500, 510, and 520. When the magnetic property of magneto caloric effect material (MCEM) 304a, 304b and 304c change the distribution of magnetic flux and the magnetic flux change can be detected by the three magnetic sensing elements 500, 510, and 520 together. The relations of the three magnetic sensing elements 500, 510, and 520 voltage and magnetic status of the magnetic flux detection apparatus 5a can be built by mathematic theoretically solution, or can be build by experimental test data. By detecting the voltage of the three magnetic sensing elements 500, 510, and 520, the magnetic status of magnetic flux detection apparatus 5a can be determined and the best thermal energy-applying algorithm can be applied.

Figure 6A:
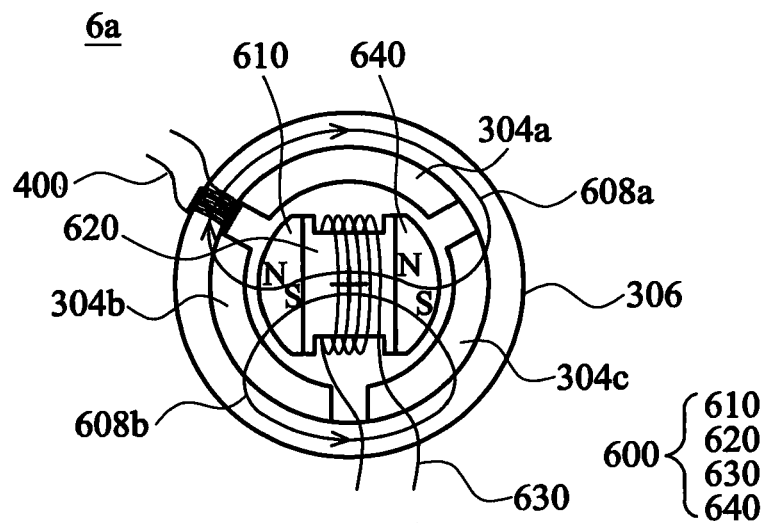
FIG. 6a is a schematic diagram showing a top view of a magnetic flux detection apparatus with a magnetic sensing element and two main magnetic flux paths when the hot thermal energy is applied to the MCEM 304a and the cold thermal energy is applied to the MCEM 304b and MCEM 304c according to a seventh preferred embodiment of the invention.

As shown in FIG. 6a, a magnetic flux detection apparatus 6a is provided as a seventh preferred embodiment of the invention. The magnetic flux detection apparatus 6a includes a magnetic material 306, at least one heated or cooled magneto caloric effect material (MCEM) 304a, 304b, 304c, and the permanent magnetic element 600, at least one magnetic sensing element 400, and at least one amount of magnetic flux or magnetic flux path 608a, 608b. The permanent magnetic element 600 includes a first magnet 610, a first magnetic material 620, an exciting coil 630, and a second magnet 640. The first magnetic material 620 is disposed with the first magnet 610. The exciting coil 630 surrounding the first magnetic material 620 is input with an exciting control signal. The second magnet 640 is disposed with the first magnetic material 620. The first magnetic material 620 can also be a yoke.

In addition, the exciting coil 630 can be an electrical conductive coil or a superconductor coil, and the magnetic flux paths or the amounts of the magnetic flux 608a, 608b are changed after the exciting control signal is input to the exciting coil 630. An exciting coil 630 is introduced and a sine wave voltage is applied to the exiting coil 630. The applying sine wave voltage will influence the amount of the magnetic flux provided by the magnetic poles (N pole and S pole) of the first magnet 610 and the magnetic poles (N pole and S pole) of the second magnet 640. Therefore, a magnetic flux with small amount of variation is generated. The flux variation frequency and the voltage frequency applied to exciting coil 630 are same frequency.

Figure 6B:
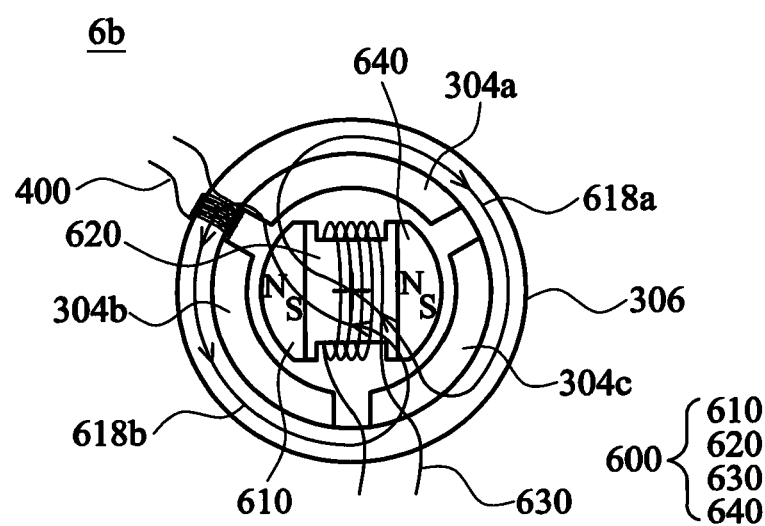
FIG. 6b is a schematic diagram showing a top view of a magnetic flux detection apparatus with the other type of magnetic sensing element and two main magnetic flux paths when the hot thermal energy is applied to the MCEM 304b and the cold thermal energy is applied to the MCEM 304c and MCEM 304a according to a eighth preferred embodiment of the invention.

The flux variation introduced by exciting voltage will influence the magnetic sensing element 400 and induce a same frequency voltage variation. The voltage variation sensed by the magnetic sensing element 400 is proportional to the change of total amounts of the magnetic flux from the status in FIG. 6a to the status in FIG. 6b as an eighth preferred embodiment of the invention. In FIG. 6b, the hot thermal energy is applied to the magneto caloric effect material (MCEM) 304b and cold thermal energy is applied to magneto caloric effect material (MCEM) 304a and magneto caloric effect material (MCEM) 304c. The amount of magnetic flux or the magnetic flux path has changed. Therefore, the magnetic sensing element 400 can be used for outputting a sensing voltage. The relations of the voltage variation sensed by the magnetic sensing element 400 and magnetic status of the magnetic flux detection apparatus 6a can be built by mathematic theoretically solution, or can be built by experimental test data. The voltage detection can also be used for determining when the thermal energy shall be applied. In other words, the magnetic flux detection apparatus 6a can further includes a recording module and a controlling module. The functions and structures of the recording module and the controlling module are the same as the paragraph described the FIG. 4c, therefore, it is omitted in this paragraph.

Figure 7A:
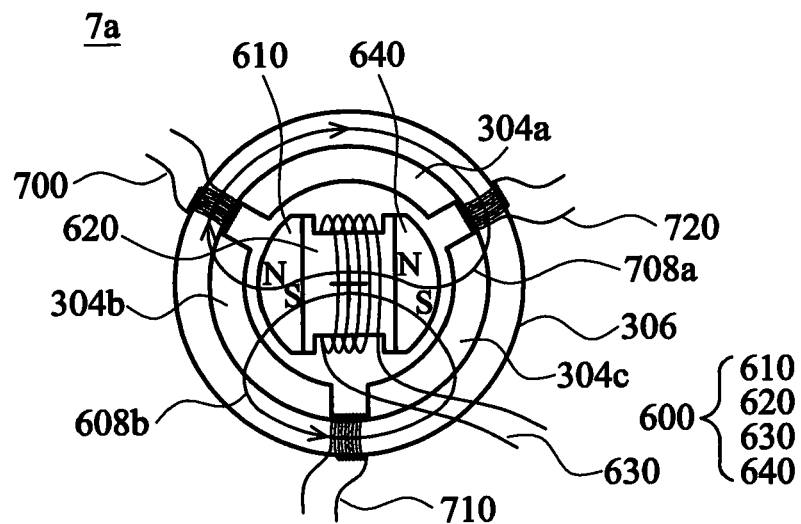
FIG. 7a is a schematic diagram showing a top view of a magnetic flux detection apparatus with three magnetic sensing elements and two main magnetic flux paths when the hot thermal energy is applied to the MCEM 304a and the cold thermal energy is applied to the MCEM 304b and MCEM 304c according to a ninth preferred embodiment of the invention.
Figure 7B:
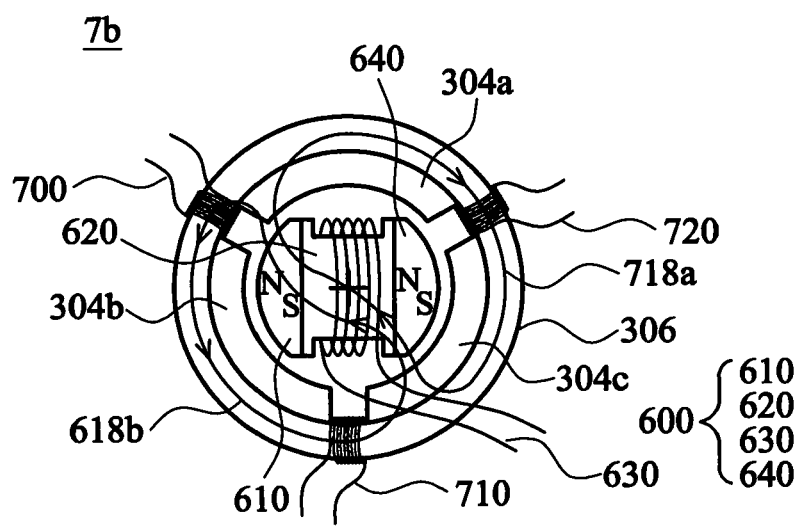
FIG. 7b is a schematic diagram showing a top view of a magnetic flux detection apparatus with three magnetic sensing elements and two main magnetic flux paths when the hot thermal energy is applied to the MCEM 304b and the cold thermal energy is applied to the MCEM 304c and MCEM 304a according to a tenth preferred embodiment of the invention.

As shown in FIG. 7a, a magnetic flux detection apparatus 7a is provided as a ninth preferred embodiment of the invention. The magnetic flux detection apparatus 7a includes a magnetic material 306, at least one heated or cooled magneto caloric effect material (MCEM) 304a, 304b, 304c, and the permanent magnetic element 600 including a first magnet 610, a first magnetic material 620, an exciting coil 630, and a second magnet 640. Three magnetic sensing elements 700, 710, and 720, and at least one major amount of magnetic flux or major magnetic flux path 708a, and 708b. The three magnetic sensing elements 700, 710, and 720, such as three coils, surround respectively in the three portions of the magnetic material 306 and sense the major amount of the magnetic flux or the major magnetic flux path 708a to induce voltages in each of the coils when the amounts of magnetic flux are changed from the status in FIG. 7a to the status in FIG. 7b as a tenth preferred embodiment of the invention. Because most of the amounts of the magnetic flux generated by the permanent magnetic element 600 will flow through the three magnetic sensing elements 700, 710, and 720. When the magnetic property of magneto caloric effect materials (MCEMs) 304a, 304b and 304c change the distribution of magnetic flux and the change of the amounts of the magnetic flux can be detected by the three magnetic sensing elements 700, 710, and 720 together. The relations of the sensed voltage from the three magnetic sensing elements 700, 710, and 720 and magnetic status of the magnetic flux detection apparatus 7a can be built by mathematic theoretically solution, or can be built by experimental test data. By detecting the voltage of the three magnetic sensing elements 700, 710, 720, the magnetic status of magnetic flux detection apparatus 7a can be determined and the best thermal energy-applying algorithm can be applied. The voltage detection can also be used for determining when the thermal energy shall be applied. In other words, the magnetic flux detection apparatus 7a can further includes a recording module and a controlling module. The functions and structures of the recording module and the controlling module are the same as the paragraph described the FIG. 4c, therefore, it is omitted in this paragraph.

Figure 8A:
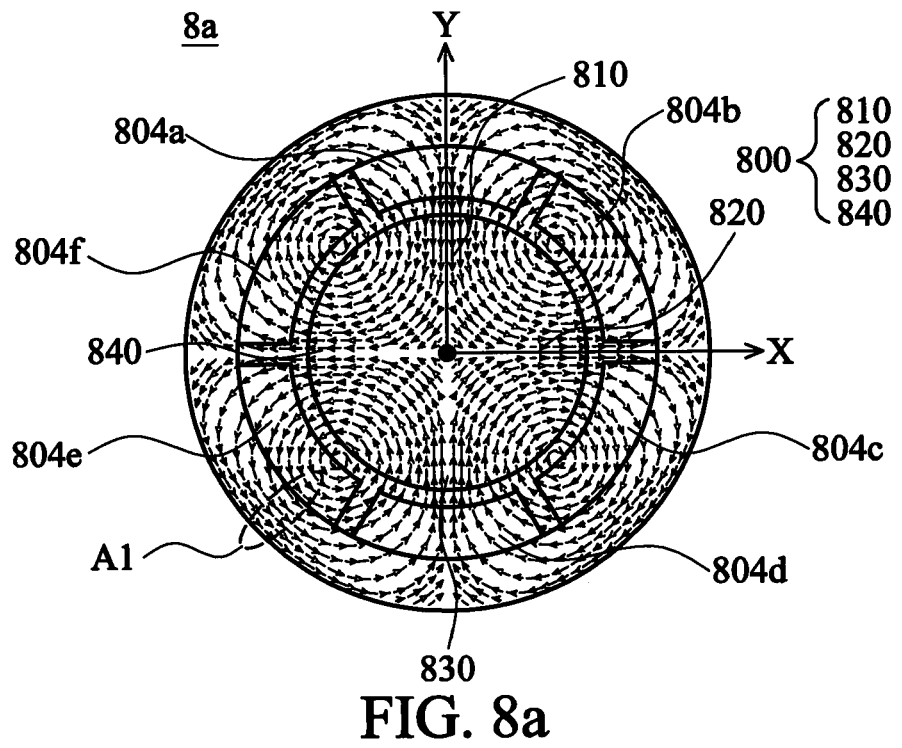
FIG. 8a is a schematic diagram showing simulating magnetic flux paths of a magnetic flux detection apparatus with a magnetic material, six MCEMs, and a permanent magnetic element with four poles, the temperature of MCEM 804b and the temperature of MCEM 804e are higher than their corresponding Curie temperatures respectively, and the temperature of MCEM 804a, the temperature of MCEM 804f, the temperature of MCEM 804c, and the temperature of MCEM 804d are lower than their corresponding Curie temperatures respectively.

FIG. 8a is a schematic diagram showing simulating the amounts of the magnetic flux or the magnetic flux paths of a magnetic flux detection apparatus 8a with a magnetic material 806, six magneto caloric effect materials (MCEMs) 804a, 804b, 804c, 804d, 804e, and 804f, and a permanent magnetic element 830 with four poles (two pair poles). Here, the permanent magnetic element 830 is the Hitachi HS-47AH NdFeB magnet. The temperature of magneto caloric effect material (MCEM) 804b and the temperature of magneto caloric effect material (MCEM) 804e are higher than their corresponding Curie temperatures respectively, and the temperature of magneto caloric effect material (MCEM) 804a, the temperature of magneto caloric effect material (MCEM) 804f, the temperature of magneto caloric effect material (MCEM) 804c, and the temperature of magneto caloric effect material (MCEM) 804d are lower than their corresponding Curie temperatures respectively. The arrows 811, 812, and 813 represent the amount and the direction of the magnetic flux.

Figure 8B:
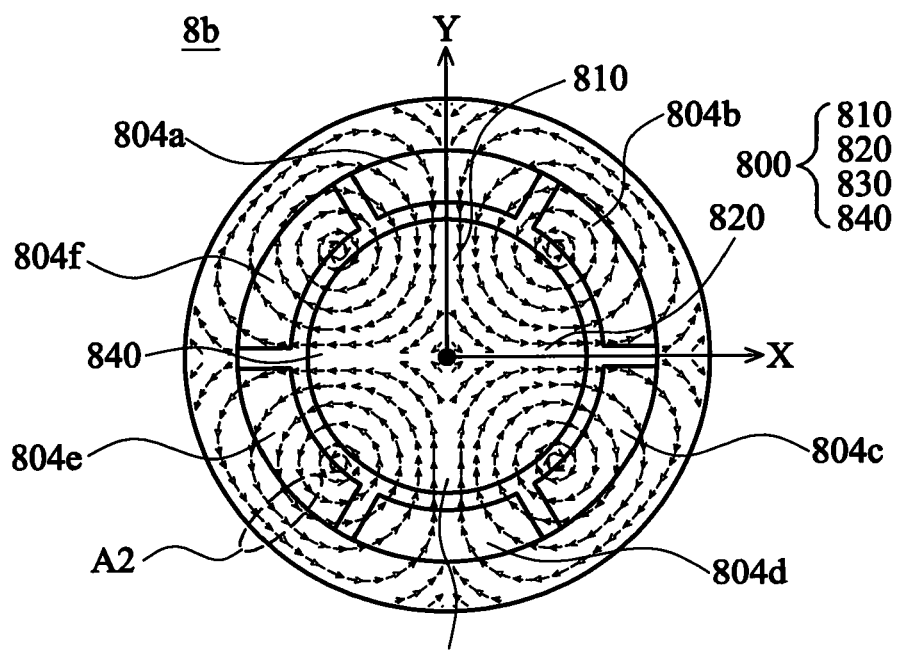
FIG. 8b is a schematic diagram showing simulating magnetic flux paths of a magnetic flux detection apparatus with a magnetic material, six MCEMs, and a permanent magnetic element with four poles, the temperature of MCEM 804c and the temperature of MCEM 804f are higher than their corresponding Curie temperatures respectively, and the temperature of MCEM 804a, the temperature of MCEM 804b, the temperature of MCEM 804d, and the temperature of MCEM 804e are lower than their corresponding Curie temperatures respectively.

Then, the heating and cooling sequence is changed. FIG. 8b is a schematic diagram showing simulating magnetic flux paths of a magnetic flux detection apparatus 8b with a magnetic material 806, six magneto caloric effect materials (MCEMs) 804a, 804b, 804c, 804d, 804e, and 804f, and a permanent magnetic element 800 with four poles 810, 820, 830, and 840. The temperature of magneto caloric effect material (MCEM) 804c and the temperature of magneto caloric effect material (MCEM) 804f are higher than their corresponding Curie temperatures respectively, and the temperature of magneto caloric effect material (MCEM) 804a, the temperature of magneto caloric effect material (MCEM) 804b, the temperature of magneto caloric effect material (MCEM) 804d, and the temperature of magneto caloric effect material (MCEM) 804e are lower than their corresponding Curie temperatures respectively.

There are few observations can be obtained. First, there are four major amounts of magnetic flux or four major magnetic flux paths in the magnetic flux detection apparatus 8a and the magnetic flux detection apparatus 8b. Second, comparing the magnetic flux distribution of the area "A1" in FIG. 8a and the area "A2" in FIG. 8b, the magnetic flux distribution will be changed after the heating and cooling sequence of magneto caloric effect materials (MCEMs) is changed. Third, in FIG. 8b, the permanent magnetic element 830 (the rotor) tends to rotate in counter clockwise (CCW) direction.

If the magnetic sensing element is located in the position of "A1" in FIG. 8a and "A2" in FIG. 8b. The magnetic flux density is reduced and induction voltage will be generated in the magnetic sensing element.

Figures 9A, 9B:
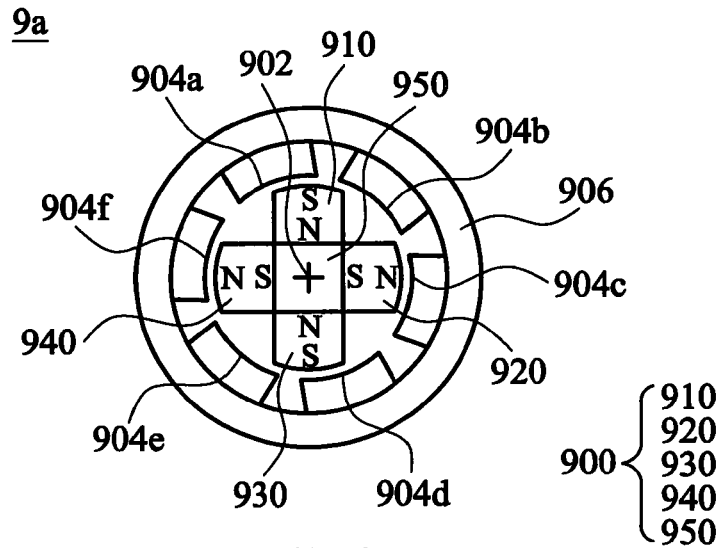

Please refer to FIG. 9a and FIG. 9b. FIG. 9a is a schematic diagram showing a top view of a magnetic flux detection apparatus 9a with a magnetic material 906, six magneto caloric effect materials (MCEMs) 904a, 904b, 904c, 904d, 904e, and 904f, and a permanent magnetic element 900 including a yoke 950 and four poles 910, 920, 930, 940 according to a eleventh preferred embodiment of the invention.

FIG. 9b is a table showing the sequence of heating and cooling the six magneto caloric effect materials (MCEMs) so as to control the rotating direction of the permanent magnetic element 900 as shown in FIG. 9a. By changing the sequence of heating and cooling of the six magneto caloric effect materials (MCEMs) according to the table, it can control the rotation direction of the permanent magnetic element 900 by fixing the rotation axis 902 of the permanent magnetic element 900 in counterclockwise direction or clockwise direction. The magnetic flux detection apparatus 9a can further include the magnetic sensing element for precisely heating or cooling the six magneto caloric effect materials (MCEMs) so as to control the rotation of the permanent magnetic element 900 to output power efficiently.

Figure 10A:
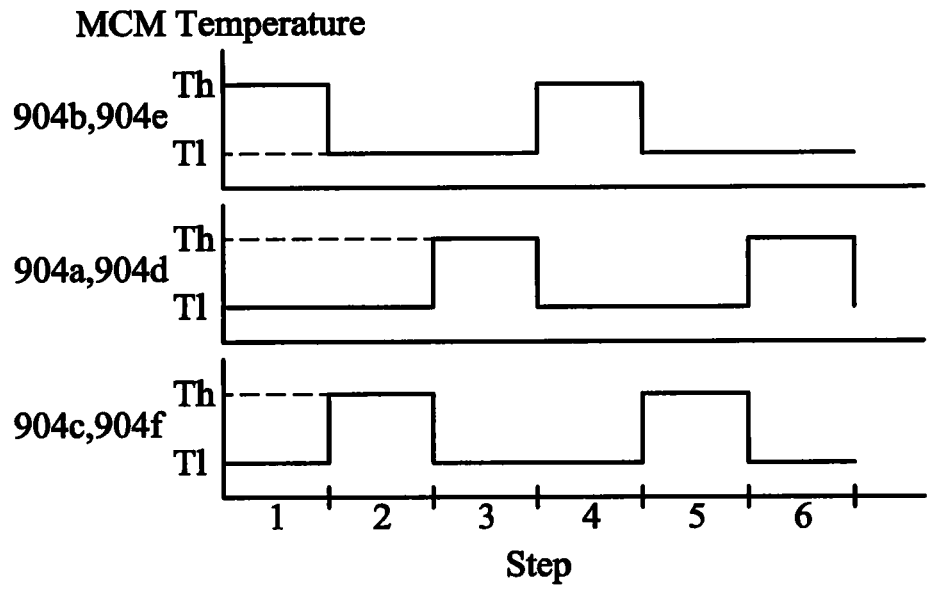
FIGS. 10a, 10b, and 10c are the temperature-versus-step diagram showing when to heat and cool the six MCEMs.
Figure 10B:
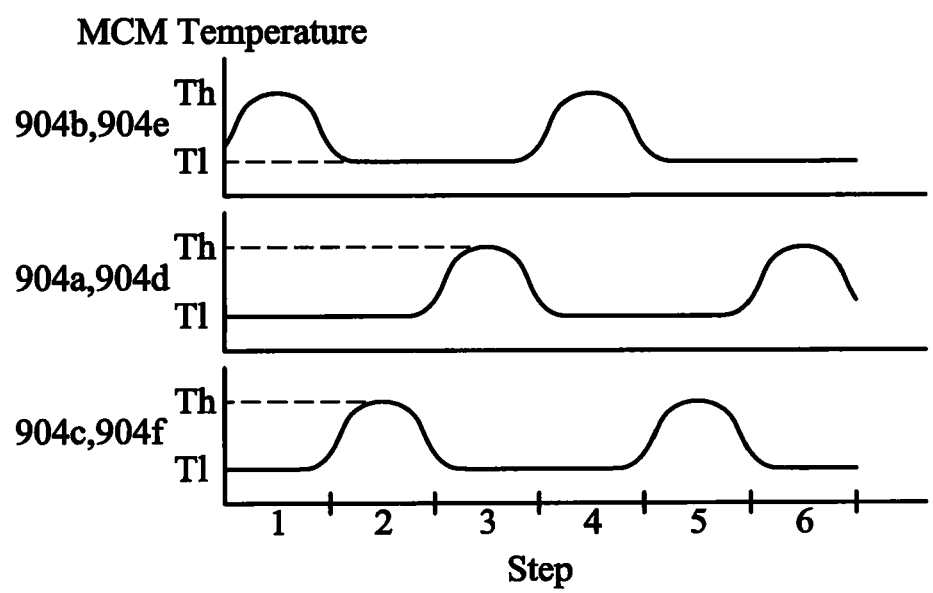
Figure 10C:
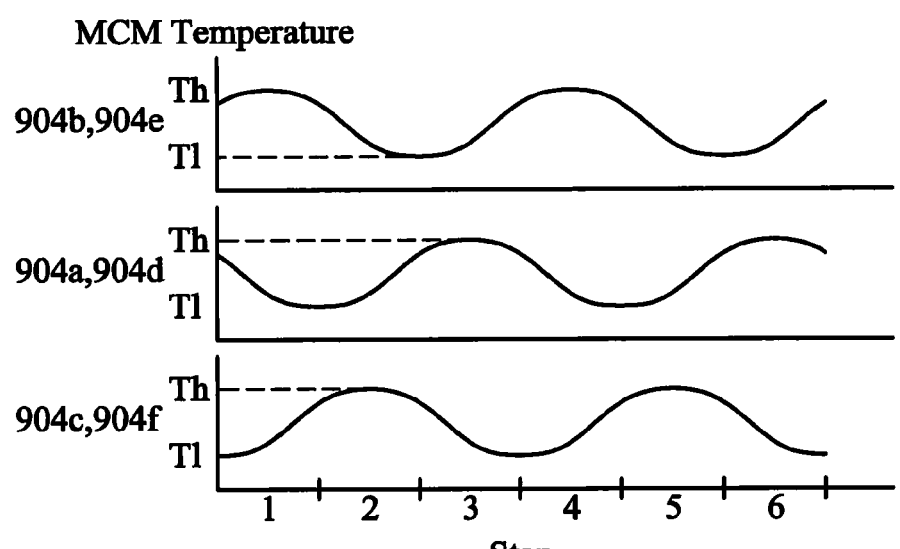

FIGS. 10a, 10b, and 10c are the temperature-versus-step diagrams showing when to heat and cool the six magneto caloric effect materials (MCEMs). To be understood, the heating and cooling waveform can be any kind of profile. The proper profile of temperature waveform is chosen base on the torque output for different kinds of applications. For example, the temperature waveform shown in FIG. 10a can deliver the maximum power and the temperature waveform shown in FIG. 10b can deliver the smoother power output. If much smoother torque output application is required, the temperature waveform shown in FIG. 10c can be used.

Figure 11A:
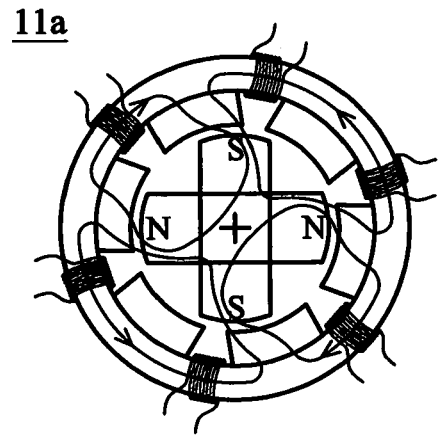
FIGS. 11a, 11b, and 11c are three schematic diagram respectively showing a top view of a magnetic flux detection apparatus with six MCEMs, a permanent magnetic element with four poles, and four main magnetic flux paths when the hot thermal energy is applied to two of the six MCEMs and the cold thermal energy is applied to four of the six MCEMs.
Figure 11B:
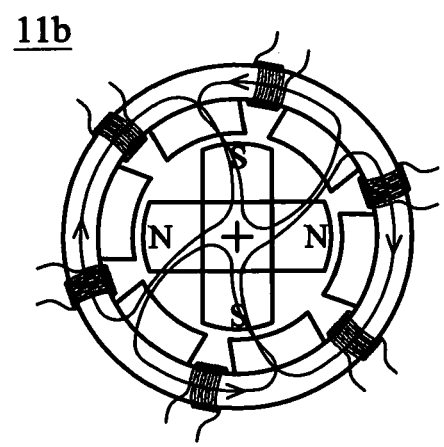
Figure 11C:
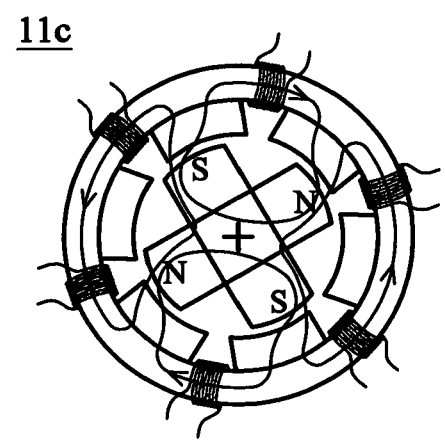
Figure 12A:
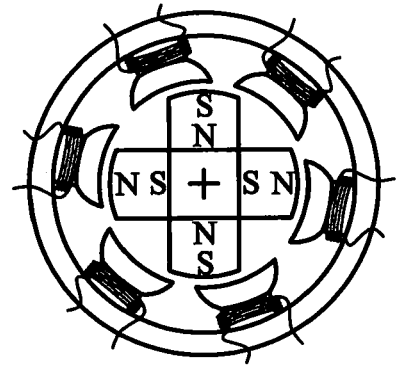
FIGS. 12a, 12b, 12c, 12d, 12e, and 12f are six schematic diagrams respectively showing a top view of a magnetic flux detection apparatus with six magnetic sensing elements disposing in different locations of the magnetic flux detection apparatus and the magnetic flux detection apparatus has different kinds of permanent magnetic elements.
Figure 12B:
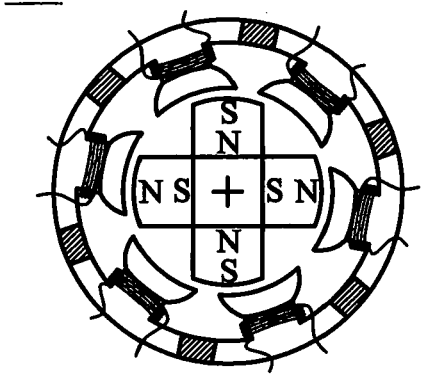
Figure 12C:
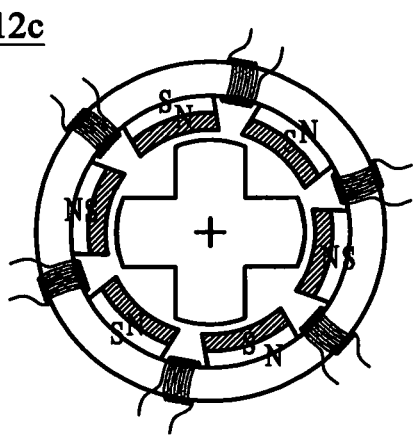
Figure 12D:
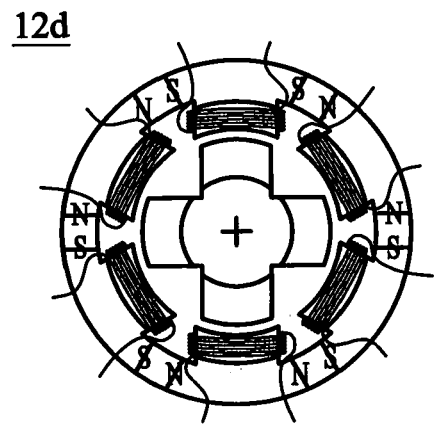
Figure 12E:
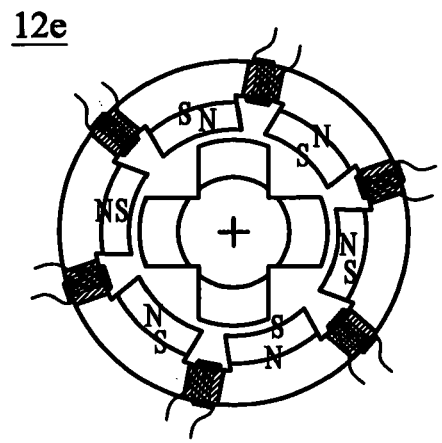
Figure 12F:
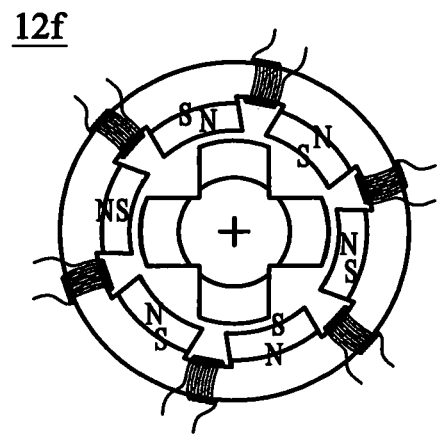

It is easy to understand, the magnetic flux detection apparatus is not limit to two magnetic poles and three magneto caloric effect materials (MCEMs). More applications can be provided as shown in FIGS. 11a, 11b, and 11c. FIGS. 11a, 11b, and 11c are three schematic diagrams respectively showing a top view of a magnetic flux detection apparatus with six magnetic sensing elements, a permanent magnetic element including four poles, and four main magnetic flux paths when the hot thermal energy is applied to two of the six magneto caloric effect materials (MCEMs) and the cold thermal energy is applied to four of the six magneto caloric effect materials (MCEMs). In addition, the permanent magnetic element can also be replaced and include just two poles. The voltage detection can also be used for determining the exact timing of thermal energy and when the thermal energy shall be applied. In other words, the magnetic flux detection apparatus (11a, 11b, 11c) can further includes a recording module and a controlling module. The functions and structures of the recording module and the controlling module are the same as the paragraph described the FIG. 4c, therefore, it is omitted in this paragraph.

FIGS. 12a, 12b, 12c, 12d, 12e, and 12f are six schematic diagrams respectively showing a top view of a magnetic flux detection apparatus with six magnetic sensing elements disposing in different locations of the magnetic flux detection apparatus and the magnetic flux detection apparatus has different kinds of permanent magnetic elements. Furthermore, the permanent magnetic element can also be replaced and includes a first amount of magnetic poles, the magnetic flux detection apparatus has a second amount of heated or cooled magneto caloric effect materials (MCEMs), the first amount is equal to the second amount, and the heated or cooled magneto caloric effect materials (MCEMs) are mechanically junction with the magnetic poles. The voltage detection can also be used for determining the exact timing of thermal energy and when the thermal energy shall be applied. In other words, the magnetic flux detection apparatus (12a, 12b, 12c, 12d, 12e, and 120 can further includes a recording module and a controlling module. The functions and structures of the recording module and the controlling module are the same as the paragraph described the FIG. 4c, therefore, it is omitted in this paragraph.

Figure 1A:
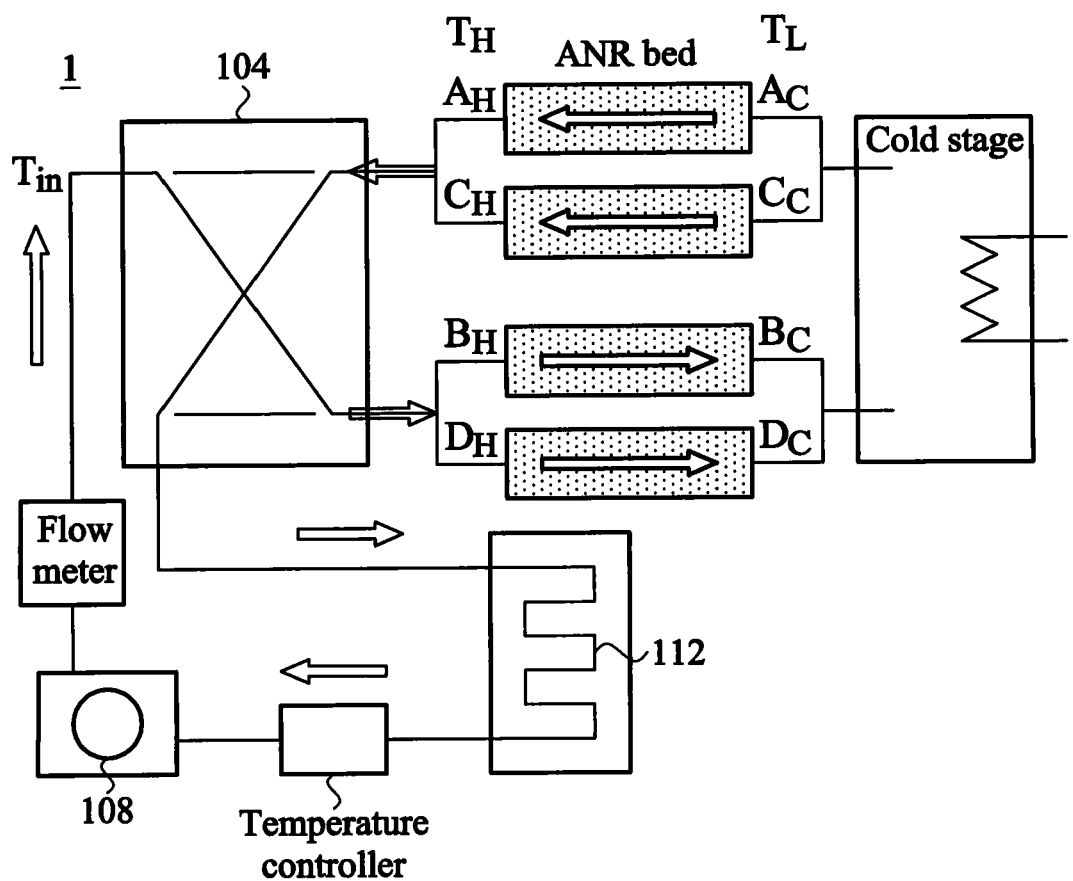
FIG. 1a is a schematic diagram of a conventional magnetic refrigerator.
Figure 1B:
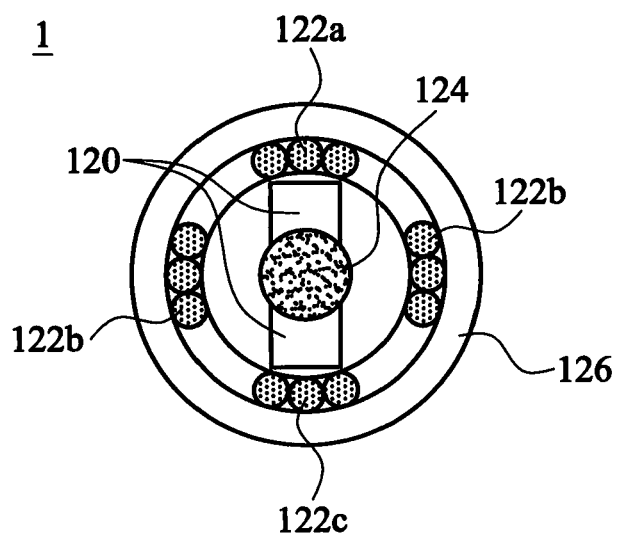
FIG. 1b is a cross sectional view of the conventional magnetic refrigerator.
Figure 2:
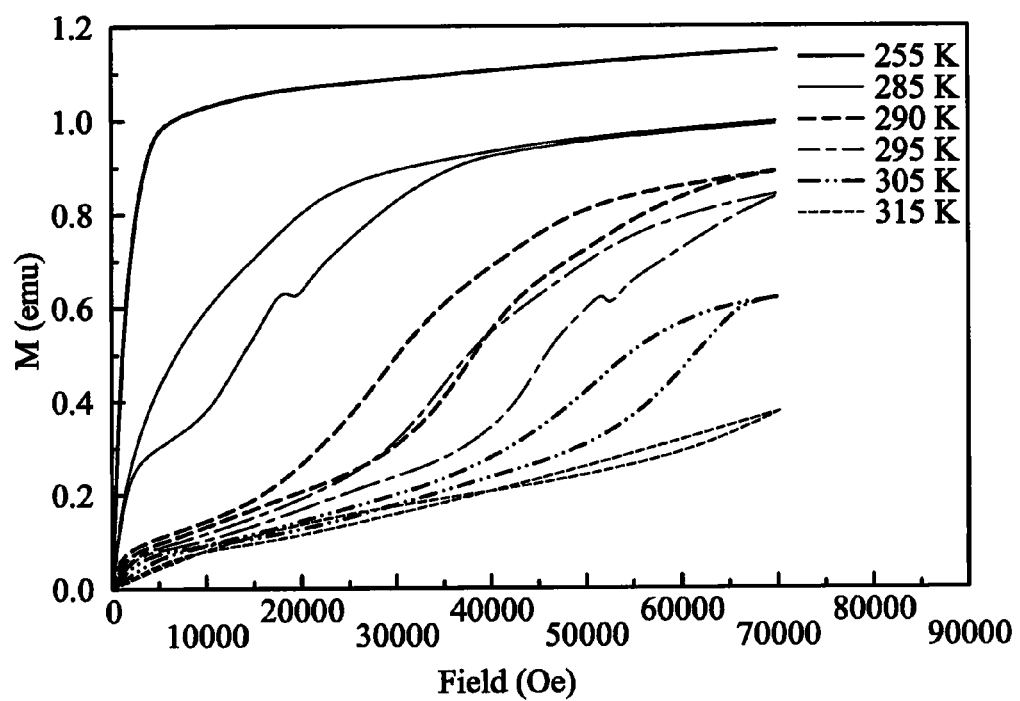
FIG. 2 shows relationship curves of the magnetic field versus the magnetized scale of the Gadolinium.

Please refer back to FIG. 1a and FIG. 1b. The application of magnetic sensing element is not only limited to above heat-power conversion, but it is also suitable for applying to the conventional magnetic refrigerator 1.

Figure 13A:
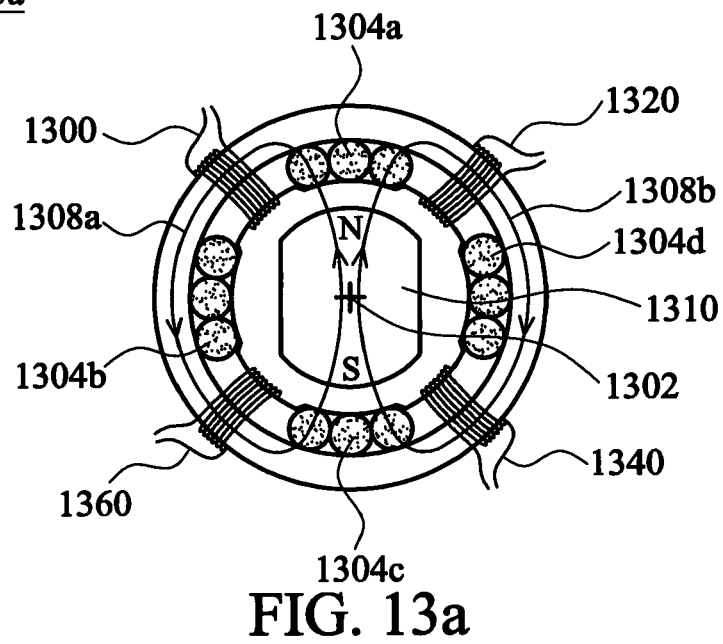
FIG. 13a is a cross sectional view of the conventional magnetic refrigerator with four sets active magnetic regenerator (AMR) beds and four magnetic sensing elements in a first state, the cold water is pumped through the first AMR bed set 1304a and the third AMR bed set 1304c.
Figure 13B:
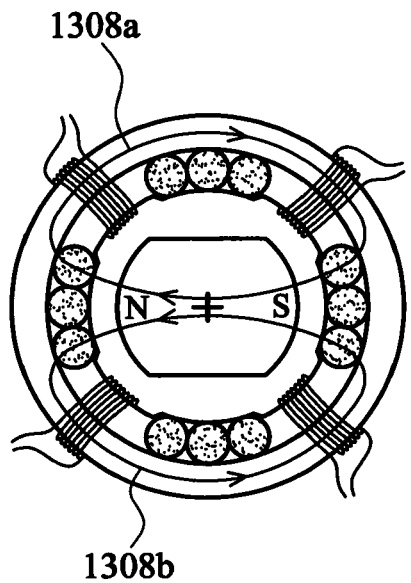
FIG. 13b is a cross sectional view of the conventional magnetic refrigerator with four sets active magnetic regenerator (AMR) beds and four magnetic sensing elements in a second state, the cold water is pumped through the second AMR bed set 1304b and the fourth AMR bed set 1304d.

Please refer to FIG. 13a and FIG. 13b. FIG. 13a is a cross sectional view of the conventional magnetic refrigerator including four sets active magnetic regenerator (AMR) beds and four magnetic sensing elements forming one part of magnetic flux detection apparatus 13c in a first state, the cold water is pumped through the first active magnetic regenerator (AMR) bed set 1304a and the third active magnetic regenerator (AMR) bed set 1304c. FIG. 13b demonstrates the conventional magnetic refrigerator 1 including four sets active magnetic regenerator (AMR) beds and four magnetic sensing elements forming one part of magnetic flux detection apparatus 13c in a second state, the cold water is pumped through the second active magnetic regenerator (AMR) bed set 1304b and the fourth active magnetic regenerator (AMR) bed set 1304d.

A magnetic flux detection apparatus 13a includes a magnetic material 1306, at least one active magnetic regenerator (AMR) bed 1304a, 1304b, 1304c, and 1304d, a permanent magnetic element 1310, at least one magnetic sensing element 1300, 1320, 1340, and 1360, and at least one amount of magnetic flux or magnetic flux path 1308a, and 1308b. Here, the permanent magnetic element 1310 is a permanent magnet or a Halbach-array magnet. The active magnetic regenerator (AMR) beds 1304a, 1304b, 1304c, and 1304d are disposed to the magnetic material 1306. The permanent magnetic element 1310 is coupled to the active magnetic regenerator (AMR) beds 1304a, 1304b, 1304c, and 1304d. The magnetic sensing element 1300 surrounds a first portion of the magnetic material 1306. The amount of magnetic flux or magnetic flux path 1304b is formed and passing through the permanent magnetic element 1310, the active magnetic regenerator (AMR) bed 1304a, and the first portion of the magnetic material 1306. The magnetic sensing element 1300 senses the amount of the magnetic flux or the magnetic flux path for outputting a sensing voltage and a correspondingly sensing voltage value. The other three magnetic sensing elements 1320, 1340, and 1360 are arranged in other three portions of the magnetic material 1306 for the same purpose.

The operation of the magnetic flux detection apparatus 13a is introduced as below. First, high amounts of magnetic flux flow through magneto caloric effect materials (MCEM) 1304a and magneto caloric effect materials (MCEM) 1304c and the temperature of magneto caloric effect materials (MCEM) 1304a and magneto caloric effect materials (MCEM) 1304c rise up. Then, cold water is pump through the magneto caloric effect materials (MCEM) 1304a and magneto caloric effect materials (MCEM) 1304c. Second, the permanent magnetic element 1310 is rotated in counterclockwise (CCW) direction and the magnetic pole N and the magnetic pole S of the permanent magnetic element 1310 are in the horizontal position as shown in the FIG. 13b. Now the magneto caloric effect materials (MCEM) 1304b and the magneto caloric effect materials (MCEM) 1304d are exposed to the large amounts of magnetic flux and the temperature of the magneto caloric effect materials (MCEM) 1304b and the magneto caloric effect materials (MCEM) 1304d rise up immediately. Cold water is pumped through them and tries to cool them down. The temperature of the magneto caloric effect materials (MCEM) 1304b and magneto caloric effect materials (MCEM) 1304d is cooled down when the cold water flows through them continuously. Because the temperature of the magneto caloric effect materials (MCEM) 1304b and magneto caloric effect materials (MCEM) 1304d drops, the magnetic moment of the magneto caloric effect materials (MCEM) 1304b and magneto caloric effect materials (MCEM) 1304d will increase gradually. The amounts of the magnetic flux passing through the magneto caloric effect materials (MCEM) 1304b and magneto caloric effect materials (MCEM) 1304d will increase when the magnetic moment of each of the magneto caloric effect materials (MCEM) 1304b and magneto caloric effect materials (MCEM) 1304d increases. Then, the magnetic sensing element 1300 will sense the change of the amount of the magnetic flux. When the temperature of the magneto caloric effect materials (MCEM) 1304b and magneto caloric effect materials (MCEM) 1304d come to stable, the change of the amount of the magnetic flux stops and so does the voltage change of the magnetic sensing element 1300 stop, too. By sensing the voltage change of magnetic sensing element 1300, the conventional magnetic refrigerator 1 can stop the cold water supply and save the thermal energy. It can also save the power of water pump of the conventional magnetic refrigerator 1.

Figure 14A:
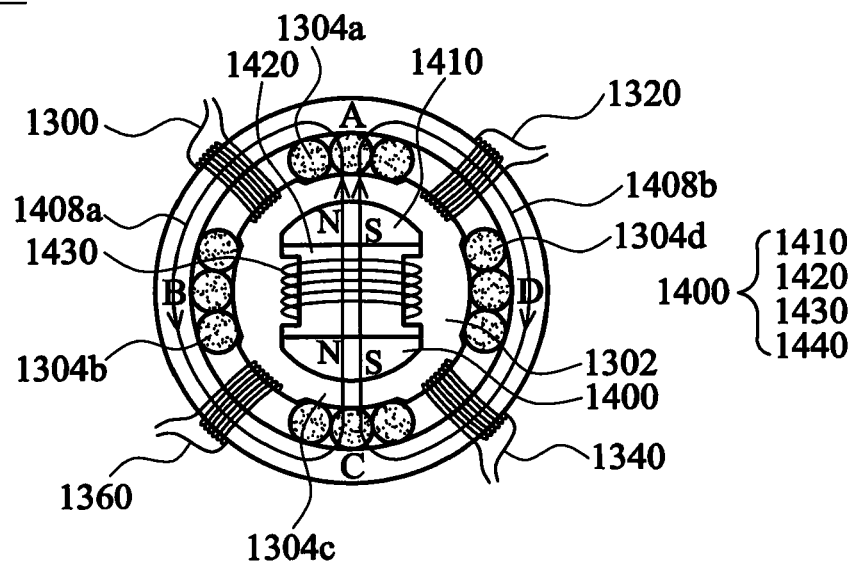
FIG. 14a is a cross sectional view of the conventional magnetic refrigerator with a permanent magnetic element including an exciting coil, four sets active magnetic regenerator (AMR) beds and four magnetic sensing elements in a first state, the cold water is pumped through the first AMR bed set 1304a and the third AMR bed set 1304c.
Figure 14B:
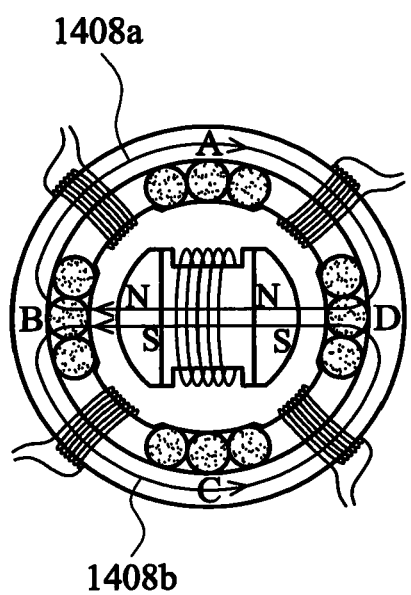
FIG. 14b is a cross sectional view of the conventional magnetic refrigerator with a permanent magnetic element including an exciting coil, four sets active magnetic regenerator (AMR) beds and four magnetic sensing elements in a second state, the cold water is pumped through the second AMR bed set 1304b and the fourth AMR bed set 1304d.

FIG. 14a and FIG. 14b shows a magnetic flux detection apparatus 14a includes a magnetic material 1306, at least one active magnetic regenerator (AMR) bed 1304a, 1304b, 1304c, and 1304d, a permanent magnetic element 1410, at least one magnetic sensing element 1300, 1320, 1340, and 1360, and at least one amount of magnetic flux or magnetic flux path 1308a, and 1308b. Here, the permanent magnetic element 1400 includes a first magnet 1410, a first magnetic material 1420, an exciting coil 1430, and a second magnet 1440. The first magnetic material 1420 is disposed with the first magnet 1410. The exciting coil 1430 surrounding the first magnetic material 1420 is input with an exciting control signal. The second magnet 1440 is disposed with the first magnetic material 1420. The first magnetic material 1420 can also be a yoke. The functions and other parts of the structures besides the permanent magnetic element 1400 of the magnetic flux detection apparatus 14a are the same as described in FIG. 13a and FIG. 13b, therefore, it is omitted in this paragraph.

In summary, the magnetic sensing element such as the coil of the invention surrounds one portion of the magnetic material to sense or detect the amount of the magnetic flux or the magnetic flux path to determine the voltage generated by the magnetic flux detection apparatus so as to apply the best thermal energy-applying algorithm into the magnetic system to acquire power efficiently. Compared with the prior art, the invention can provide a better working condition of the magnetic device and the whole magnetic system can be selected for demonstrating a better performance.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A magnetic system, comprising:
   a magnetic apparatus, comprising:
      a magnetic material;
      at least one heated or cooled magneto caloric effect material disposed to the magnetic material; and
      a permanent magnetic element coupled to the magneto caloric effect material; and
   a magnetic flux detection apparatus comprising a magnetic sensing element surrounding a first portion of the magnetic material to sense a magnetic flux or magnetic flux path formed and passing through the permanent magnetic element, the cooled or heated magneto caloric effect material, and the first portion of the magnetic material, and to output a sensing voltage.

2. The magnetic system as recited in claim 1, further comprising:
   a recording module having a sensing voltage table recording at least one predetermined sensing voltage value corresponding to at least one thermal controlling signal respectively; and
   a controlling module searching the recording module to receive a sensing voltage level corresponding to the sensing voltage value, wherein when the correspondingly sensing voltage value matches the predetermined sensing voltage value, the controlling module generates the thermal controlling signal to heat or cool the magneto caloric effect material.

3. The magnetic system as recited in claim 2, wherein the permanent magnetic element is a magnet with at least two magnetic poles and rotates after the controlling module generates the thermal controlling signal to heat or cool the magneto caloric effect material.

4. The magnetic system as recited in claim 1, wherein the permanent magnetic element comprises:
   a first magnet;
   a first magnetic material disposed with the first magnet;
   an exciting coil surrounding the first magnetic material and controlled by an exciting control signal; and
   a second magnet disposed with the first magnetic material.

5. The magnetic system as recited in claim 4, wherein the exciting coil is an electrical conductive coil or a superconductor coil, and the magnetic flux path or the amount of the magnetic flux is changed after the exciting control signal is input to the exciting coil.

6. The magnetic system as recited in claim 1, wherein the magnetic sensing element is a coil.

7. The magnetic system as recited in claim 1, wherein the magnetic material is a high permeability magnetic material or a yoke.

8. The magnetic system as recited in claim 1, wherein the heated or cooled magneto caloric effect material is a single-layer magneto caloric effect material with a single curie temperature.

9. The magnetic system as recited in claim 1, wherein the heated or cooled magneto caloric effect material is a multiple-layers magneto caloric effect material with a plurality of curie temperatures and each layer of the multiple-layer magneto caloric effect material has a single curie temperature.

10. The magnetic system as recited in claim 9, wherein each layer of the multiple-layer magneto caloric effect material is disposed sequentially according to the single curie temperature of each layer of the multiple-layers magneto caloric effect material.

11. The magnetic system as recited in claim 1, wherein the magnetic material is formed with a circle-shaped, oval-shaped, rectangular-shaped, annular-shaped, or polygonal-shaped structure.

12. The magnetic system as recited in claim 11, wherein the heated or cooled magneto caloric effect material is attached along with the magnetic material.

13. The magnetic system as recited in claim 12, wherein the permanent magnetic element is disposed in the magnetic material.

14. The magnetic system as recited in claim 13, wherein the heated or cooled magneto caloric effect material is a multiple-layers magneto caloric effect material with a plurality of curie temperatures.

15. The magnetic system as recited in claim 14, wherein each layer of the multiple-layer magneto caloric effect material has a single curie temperature.

16. The magnetic system as recited in claim 15, wherein each layer of the multiple-layer magneto caloric effect material is disposed sequentially according to the single curie temperature of each layer of the multiple-layers magneto caloric effect material.

17. The magnetic system as recited in claim 1, wherein the permanent magnetic element has two magnetic poles, and the magnetic flux detection apparatus has three or six heated or cooled magneto caloric effect materials.

18. The magnetic system as recited in claim 2, wherein the permanent magnetic element has two magnetic poles, and the magnetic flux detection apparatus has three or six heated or cooled magneto caloric effect materials.

19. The magnetic system as recited in claim 1, wherein the permanent magnetic element has four magnetic poles, and the magnetic flux detection apparatus has six heated or cooled magneto caloric effect materials.

20. The magnetic system as recited in claim 2, wherein the permanent magnetic element has four magnetic poles, and the magnetic flux detection apparatus has six heated or cooled magneto caloric effect materials.

21. The magnetic system as recited in claim 1, wherein the permanent magnetic element has a first amount of magnetic poles, the magnetic flux detection apparatus has a second amount of heated or cooled magneto caloric effect materials, the first amount is equal to the second amount, and the heated or cooled magneto caloric effect materials are mechanically junction with the magnetic poles.

22. The magnetic system as recited in claim 2, wherein the permanent magnetic element has a first amount of magnetic poles, the magnetic flux detection apparatus has a second amount of heated or cooled magneto caloric effect materials, the first amount is equal to the second amount, and the heated or cooled magneto caloric effect materials are mechanically junction with the magnetic poles.

23. The magnetic system as recited in claim 2, wherein there is at least one cooled magneto caloric effect material be heated periodically and at least one heated magneto caloric effect material be alternately cooled periodically and disposed to the magnetic material, and the permanent magnetic element with at least two magnetic poles rotates after the controlling module generates the thermal controlling signal to heat the cooled magneto caloric effect material or cool the heated magneto caloric effect material periodically.

24. The magnetic system as recited in claim 23, wherein the permanent magnetic element comprises:
- a first magnet;
- a first magnetic material disposed with the first magnet;
- an exciting coil surrounding the first magnetic material and input with a exciting control signal; and
- a second magnet disposed with the first magnetic material.

25. The magnetic system as recited in claim 24, wherein the exciting coil is an electrical conductive coil or a superconductor coil, and the magnetic flux path or the amount of the magnetic flux is changed after the exciting control signal is input to the exciting coil.

\* \* \* \* \*